US012680165B2

(12) United States Patent
Franklin

(10) Patent No.: US 12,680,165 B2
(45) Date of Patent: Jul. 14, 2026

(54) METHOD OF FORMING HOLES FROM BOTH SIDES OF SUBSTRATE

(71) Applicant: APPLIED MATERIALS, INC., Santa Clara, CA (US)

(72) Inventor: Timothy Joseph Franklin, Campbell, CA (US)

(73) Assignee: Applied Materials Inc., Santa Clara, CA (US)

( * ) Notice: Subject to any disclaimer, the term of this patent is extended or adjusted under 35 U.S.C. 154(b) by 527 days.

(21) Appl. No.: 16/945,461

(22) Filed: Jul. 31, 2020

(65) Prior Publication Data

US 2021/0310122 A1      Oct. 7, 2021

Related U.S. Application Data

(60) Provisional application No. 63/005,118, filed on Apr. 3, 2020.

(51) Int. Cl.
*C23C 16/455*      (2006.01)
(52) U.S. Cl.
CPC .............................. *C23C 16/45565* (2013.01)
(58) Field of Classification Search
CPC ........ C23C 16/45565; B23B 2220/445; B23B 35/00; B23B 39/16; B23K 26/0604; B23K 26/0823; B23K 26/127; B23K 26/362; B23K 26/382; B23K 26/40; B23K 26/402; B26F 1/16; B26F 1/26
See application file for complete search history.

(56) References Cited

U.S. PATENT DOCUMENTS

| | | | |
|---|---|---|---|
| 2,393,696 A | 1/1946 | Kraut et al. | |
| 7,887,712 B2 | 2/2011 | Boyle et al. | |
| 8,258,429 B2 * | 9/2012 | Kobayashi ......... | B23K 26/0624 219/121.72 |

(Continued)

FOREIGN PATENT DOCUMENTS

| | | |
|---|---|---|
| CN | 107262768 A | 10/2017 |
| CN | 107378274 A | 11/2017 |

(Continued)

OTHER PUBLICATIONS

International Search Report and Written Opinion mailed Jul. 21, 2021, for Application No. PCT/US2021/025434.

*Primary Examiner* — Dah-Wei D. Yuan
*Assistant Examiner* — Nga Leung V Law
(74) *Attorney, Agent, or Firm* — Moser Taboada

(57) ABSTRACT

Methods and apparatus for forming holes through a substrate are provided herein. In some embodiments, a method of forming holes in a substrate for use in a process chamber includes: partially forming the plurality of holes in a substrate using a first drill to form a plurality of rough holes through the substrate from a first side of the substrate to an opposite second side of the substrate; positioning the substrate between a second drill and a third drill; using the second drill to finish the plurality of rough holes from the first side of the substrate to a first location at least halfway along the length of each hole of the plurality of rough holes; and using the third drill to finish the plurality of rough holes from the second side of the substrate to at least the first location along the length of each hole of the plurality of rough holes.

12 Claims, 4 Drawing Sheets

(56)                References Cited

U.S. PATENT DOCUMENTS

| | | | |
|---|---|---|---|
| 2003/0150112 A1 | 8/2003 | Upadhya | |
| 2003/0150845 A1* | 8/2003 | Tian | B23K 26/1436 |
| | | | 219/121.84 |
| 2003/0188685 A1* | 10/2003 | Wang | C23C 16/4404 |
| | | | 204/298.11 |
| 2003/0193117 A1* | 10/2003 | Schreiner | H05K 3/0038 |
| | | | 264/400 |
| 2005/0251990 A1* | 11/2005 | Choi | C23C 16/45565 |
| | | | 29/458 |
| 2010/0006031 A1* | 1/2010 | Choi | C23C 16/45565 |
| | | | 118/723 R |
| 2012/0168412 A1* | 7/2012 | Hooper | B23K 26/382 |
| | | | 219/121.68 |
| 2013/0299009 A1* | 11/2013 | Jiang | C23C 16/45572 |
| | | | 137/15.01 |
| 2014/0213061 A1 | 7/2014 | Bettencourt et al. | |

| | | | |
|---|---|---|---|
| 2015/0174716 A1 | 6/2015 | Suyama | |
| 2020/0118795 A1* | 4/2020 | Selep | H01J 37/3244 |
| 2020/0316734 A1* | 10/2020 | Francoeur | B23K 26/382 |

FOREIGN PATENT DOCUMENTS

| | | | |
|---|---|---|---|
| JP | S52 28791 A | 3/1977 |
| JP | S60207746 A | 10/1985 |
| JP | H02152757 A | 6/1990 |
| JP | 2000151065 A | 5/2000 |
| JP | 2003-080410 A | 3/2003 |
| JP | 2008084858 A | 4/2008 |
| JP | 2008218530 A | 9/2008 |
| JP | 2010162641 A | 7/2010 |
| JP | 2010247281 A | 11/2010 |
| JP | 2011143434 A | 7/2011 |
| JP | 2013169617 A | 9/2013 |
| KR | 100643803 B1 | 11/2006 |
| KR | 102041055 B1 | 11/2019 |

* cited by examiner

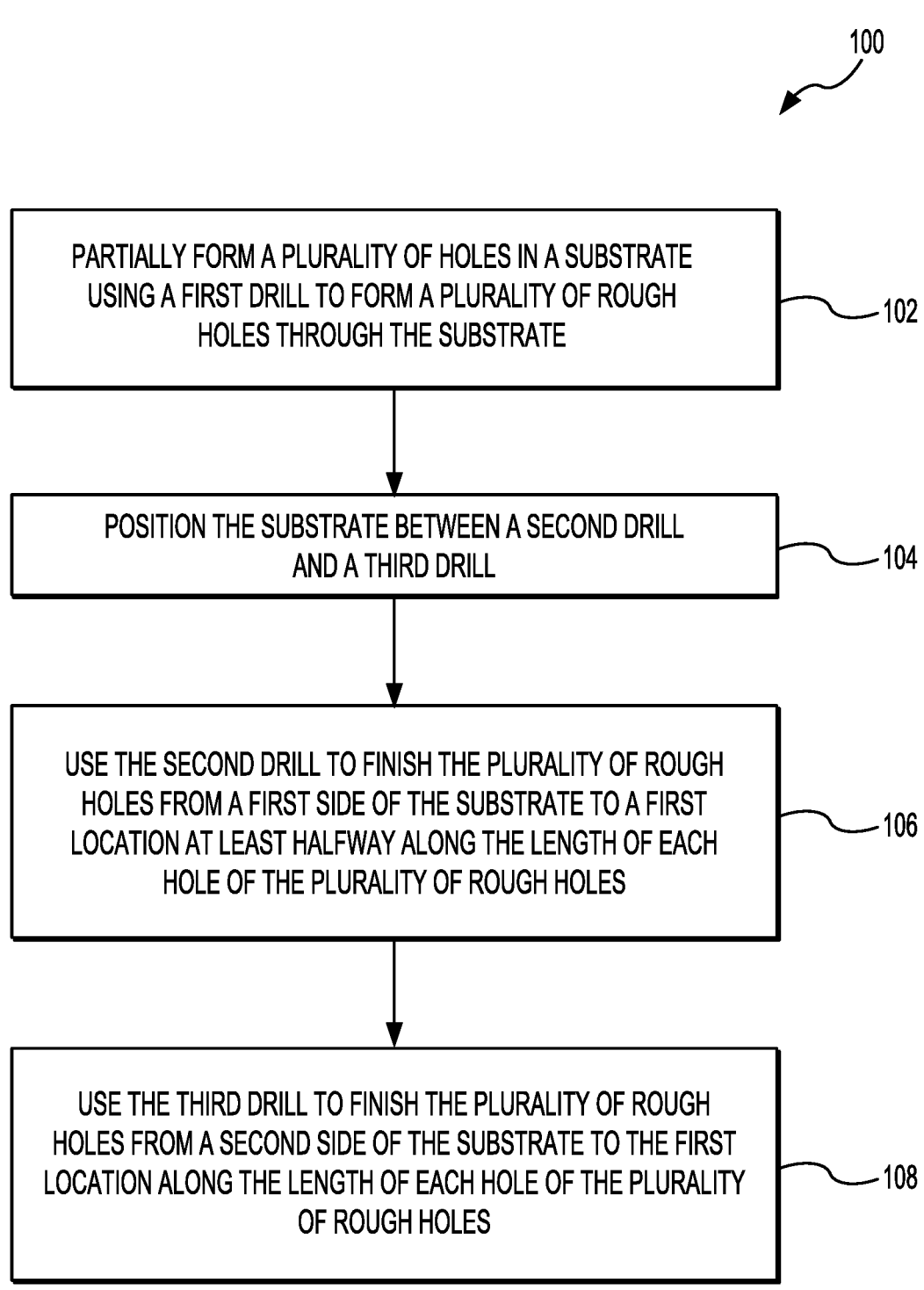

100

PARTIALLY FORM A PLURALITY OF HOLES IN A SUBSTRATE USING A FIRST DRILL TO FORM A PLURALITY OF ROUGH HOLES THROUGH THE SUBSTRATE — 102

POSITION THE SUBSTRATE BETWEEN A SECOND DRILL AND A THIRD DRILL — 104

USE THE SECOND DRILL TO FINISH THE PLURALITY OF ROUGH HOLES FROM A FIRST SIDE OF THE SUBSTRATE TO A FIRST LOCATION AT LEAST HALFWAY ALONG THE LENGTH OF EACH HOLE OF THE PLURALITY OF ROUGH HOLES — 106

USE THE THIRD DRILL TO FINISH THE PLURALITY OF ROUGH HOLES FROM A SECOND SIDE OF THE SUBSTRATE TO THE FIRST LOCATION ALONG THE LENGTH OF EACH HOLE OF THE PLURALITY OF ROUGH HOLES — 108

*FIG. 1*

METHOD OF FORMING HOLES FROM BOTH SIDES OF SUBSTRATE

CROSS-REFERENCE TO RELATED APPLICATIONS

This application claims benefit of U.S. provisional patent application Ser. No. 63/005,118, filed Apr. 3, 2020 which is herein incorporated by reference in its entirety.

FIELD

Embodiments of the present disclosure generally relate to substrate processing equipment.

BACKGROUND

Deposition and etch chambers (process chambers) are typically used in the manufacturing of semiconductor devices. Some components disposed within these process chambers include holes. For example, a gas distribution plate for use in a process chamber may include holes with high aspect ratios to distribute one or more process fluids within the process chamber. The holes may be formed using a single drill. However, the inventor has observed that forming the holes with high fidelity using a single drill may require more expensive drills, may require more power draw, and may decrease throughput.

Accordingly, the inventor has provided improved methods and apparatus for forming holes through a process chamber component.

SUMMARY

Methods and apparatus for forming holes through a substrate are provided herein. In some embodiments, a method of forming holes in a substrate for use in a process chamber includes: partially forming the plurality of holes in a substrate using a first drill to form a plurality of rough holes through the substrate from a first side of the substrate to an opposite second side of the substrate; positioning the substrate between a second drill and a third drill; using the second drill to finish the plurality of rough holes from the first side of the substrate to a first location at least halfway along the length of each hole of the plurality of rough holes; and using the third drill to finish the plurality of rough holes from the second side of the substrate to at least the first location along the length of each hole of the plurality of rough holes.

In some embodiments, a method of forming holes in a substrate for use in a process chamber includes mounting the substrate on a substrate support in a first position; forming a plurality of rough holes through the substrate to a first size using a first drill; rotating the substrate by about 45 degrees to about 135 degrees to a second position; and finishing a first set of the plurality of rough holes from a first side of the substrate to a second size using a second drill while finishing a second set of the plurality of rough holes different than the first set from a second side of the substrate opposite the first side to the second size using a third drill.

In some embodiments, an apparatus for forming holes in a substrate includes a substrate support having a one or more retaining surfaces for holding a substrate and a central opening to expose a bottom surface of the substrate, wherein the substrate support is configured to rotate about a central axis of the substrate support and about an elongate axis of the substrate support orthogonal to the central axis; a first drill disposed above the substrate support; and a second drill and a third drill disposed on opposite sides of the substrate support.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 1 depicts a flowchart of a method of forming holes in a substrate for use in a process chamber in accordance with some embodiments of the present disclosure.

Figures 2A, 2B:
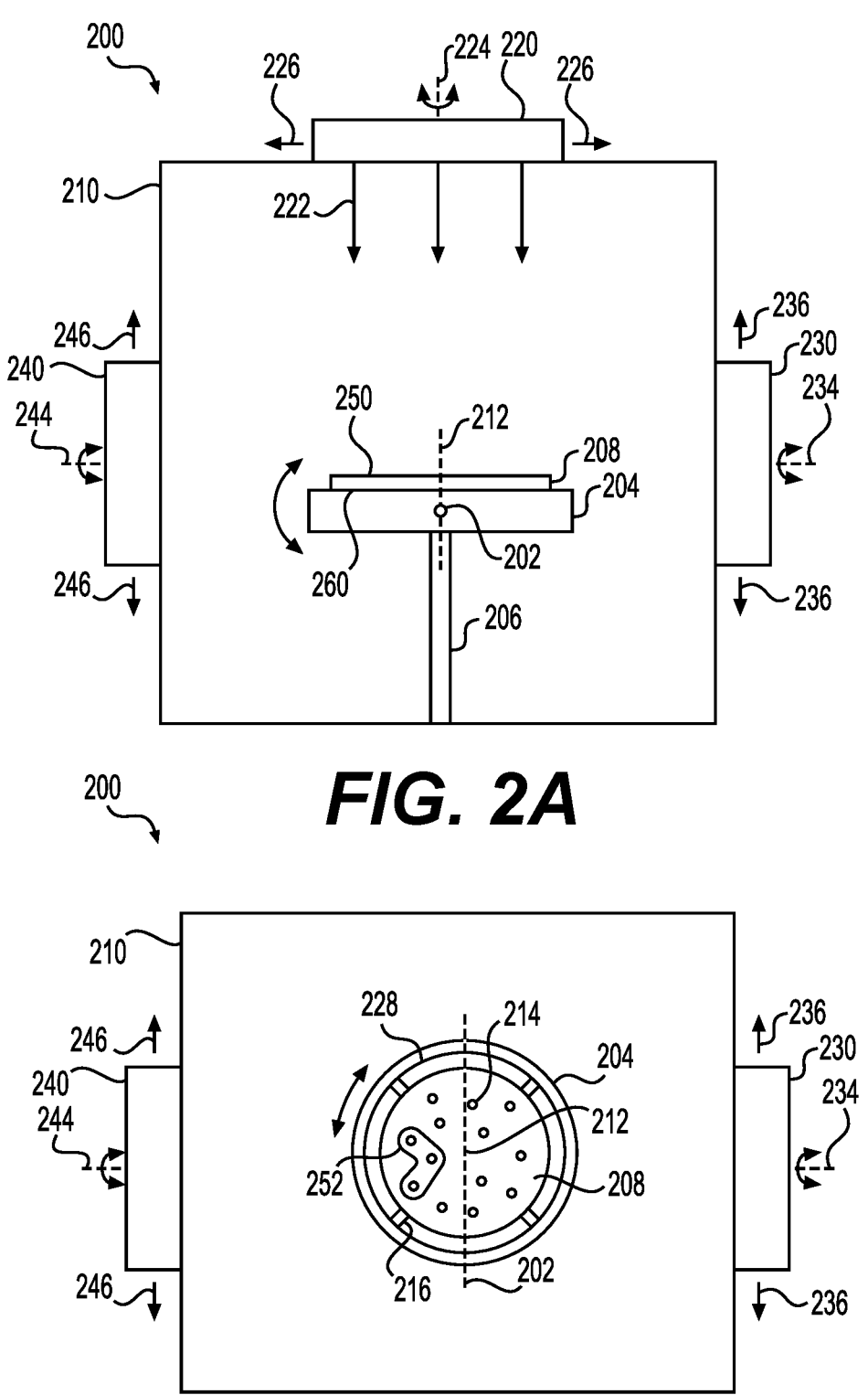
FIG. 2A depicts a schematic side view of a hole forming apparatus in a first position in accordance with some embodiments of the present disclosure.
FIG. 2B depicts a schematic top view of a hole forming apparatus in a first position in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus of forming holes in a substrate for use in a process chamber are provided herein. The method includes forming a plurality of holes through a substrate using a plurality of drills. A first drill of the plurality of drills faces a first surface of the substrate to form a plurality of rough holes through the substrate. A second set of drills of the plurality of drills finish the plurality of rough holes to form the plurality of holes. In some embodiments, the second set of drills includes a second drill and a third drill disposed on opposite sides of the substrate. In some embodiments, the second set of drills includes the first drill and a second drill disposed on an opposite side of the substrate to advantageously form the plurality of holes from both sides of the substrate.

Each drill of the second set of drills finishes the plurality of rough holes at least halfway along the length of each hole of the plurality of holes. Having each drill of the second set of drills finish the plurality of rough holes about halfway along the length of each hole of the plurality of holes advantageously reduces the power requirement from each of the second set of drills and reduces the time to form the plurality of holes through the substrate.

FIG. 1 depicts a flowchart of a method 100 of forming holes in a substrate for use in a process chamber in accordance with some embodiments of the present disclosure. In some embodiments, the method 100 may be performed by using the hole forming apparatus 200 of FIGS. 2A-5. The method begins at 102 by partially forming a plurality of holes in a substrate (e.g., substrate 208) using a first drill (e.g., first drill 220) to form a plurality of rough holes (e.g., plurality of rough holes 214) through the substrate from a first side of the substrate to an opposite second side of the substrate. The plurality of rough holes have a diameter having a first size. In some embodiments, the substrate is mounted to a substrate support (e.g., substrate support 204) prior to forming the plurality of rough holes. In some embodiments, the plurality of holes have a diameter, or first size, of about 0.005 inches to about 0.04 inches.

In some embodiments, the first drill forms a first set of one or more holes of the plurality of rough holes and then forms a next set of the one or more holes of the plurality of rough holes and continues repetitively until all of the plurality of rough holes are formed. In some embodiments, the substrate rotates about a central axis (e.g., central axis 212) of the substrate between forming sets of the plurality of rough holes using the first drill. In some embodiments, the first drill moves between forming sets of the plurality of rough holes by rotating with respect to the substrate (e.g. about central axis 224). In some embodiments, the first drill moves laterally with respect to the substrate (e.g., lateral direction 226) between formation of sets of the plurality of rough holes.

Figure 3:
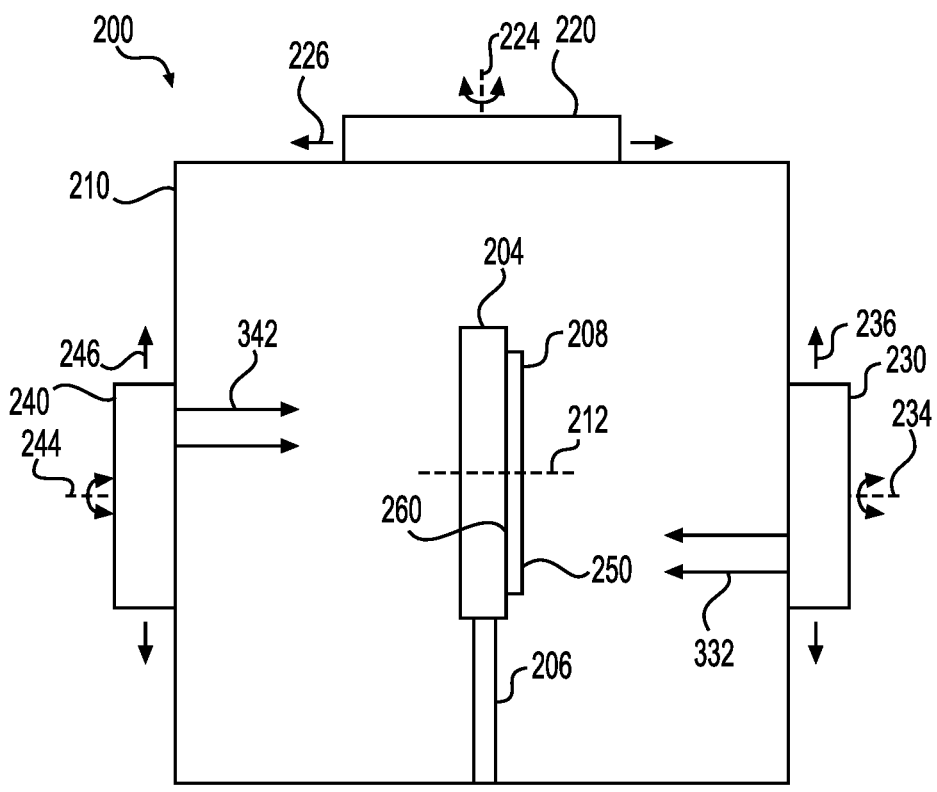
FIG. 3 depicts a schematic side view of a hole forming apparatus in a second position in accordance with some embodiments of the present disclosure.

FIG. 2A depicts a schematic side view and FIG. 2B is a schematic top view of a hole forming apparatus 200 in a first position for performing 102 in accordance with some embodiments of the present disclosure. The hole forming apparatus 200 includes a substrate 208 disposed on a substrate support 204. The substrate support 204 may rotate about a central axis 212 to rotate the substrate 208. In some embodiments, the substrate support 204 is configured to rotate about an elongate axis 202 orthogonal to the central axis 212 to move the substrate 208 from the first position to a second position as shown in FIG. 3 and described in further detail below. The substrate support 204 may be supported by one or more legs 206. In some embodiments, the one or more legs 206 comprises two legs that are rotatably coupled to the substrate support 204 on either side of the substrate support 204.

The substrate 208 includes a second side 260 facing the substrate support 204 and a first side 250 opposite the second side 260. The substrate support 204 includes one or more retaining surfaces for holding the substrate 208 and a central opening 228 to expose the second side 260, or bottom surface, of the substrate 208. In some embodiments, the one or more retaining surfaces is an annular ledge that extends into the central opening 228. In some embodiments, as shown in FIG. 2B, the one or more retaining surfaces include a plurality of mounting tabs 216 extending into the central opening 228.

The substrate 208 may be made of a material suitable for use in a process chamber. In some embodiments, the substrate 208 is made of a material comprising silicon (Si), for example, silicon carbide (SiC), polysilicon, or single-crystal silicon. In some embodiments, the substrate 208 is made of a metal, for example, aluminum or molybdenum. In some embodiments, the substrate 208 has a thickness (i.e., height) of about 2.0 mm to about 20.0 mm. In some embodiments, the substrate 208 has a thickness of about 8.0 mm to about 15.0 mm. In some embodiments, the substrate 208 is a gas distribution plate for use in a process chamber. In some embodiments, the substrate 208 is a round plate.

A first drill 220 is disposed above the substrate support 204. In the first position, the first drill 220 faces the first side 250 of the substrate 208. In some embodiments, the first drill 220 is configured to move in a lateral direction 226 (e.g., up/down/left/right) with respect to the first surface 205. In some embodiments, the first drill 220 is configured to rotate with respect to the substrate 208 about a central axis 224 of the first drill 220. In some embodiments, the central axis 224 of the first drill 220 is parallel to the central axis 212 of the substrate 208 when the substrate is in the first position.

In some embodiments, the first drill 220 is a laser drill configured to direct photon energy 222 to remove material from the substrate 208 to form a plurality of rough holes 214. In some embodiments, the plurality of rough holes 214 include a plurality of sets, where each set include a multiple holes that make up the plurality of rough holes 214. For example, the plurality of rough holes 214 includes a first set 252. In some embodiments, the first drill 220 is the laser drill having a plurality of laser heads to form multiple holes (e.g., the first set 252) simultaneously.

In some embodiments, the first drill 220 is a rotary drill configured to machine the plurality of rough holes 214. In some embodiments, the first drill 220 is a rotary drill having a plurality of drill bits to form multiple holes of the plurality of rough holes 214 simultaneously. In some embodiments, the first drill 220 is a water drill configured to direct high-pressure water at the substrate 208 to form the plurality of rough holes 214.

In some embodiments, the first drill 220 is a water drill having a plurality of high-pressure water streams to form multiple holes of the plurality of rough holes 214 simultaneously. In some embodiments, the first drill 220 is a sonic drill configured to finish the plurality of rough holes 214. In some embodiments, the first drill 220 is a sonic drill having a plurality of sonic drill bits to finish multiple holes of the plurality of rough holes 214 simultaneously.

In some embodiments, a second drill 230 and a third drill 240 are disposed opposite each other on either side of the substrate support 204. In some embodiments, the second drill 230 is configured to move in a lateral direction 236 (e.g., up/down/left/right) with respect to substrate support 204. In some embodiments, the third drill 240 is configured to move in a lateral direction 246 (e.g., up/down/left/right) with respect to substrate support 204. In some embodiments, the second drill 230 is configured to rotate with respect to the substrate 208 along a central axis 234 of the second drill 230. In some embodiments, the third drill 240 is configured to rotate with respect to the substrate 208 along a central axis 244 of the third drill 240.

Figure 5:
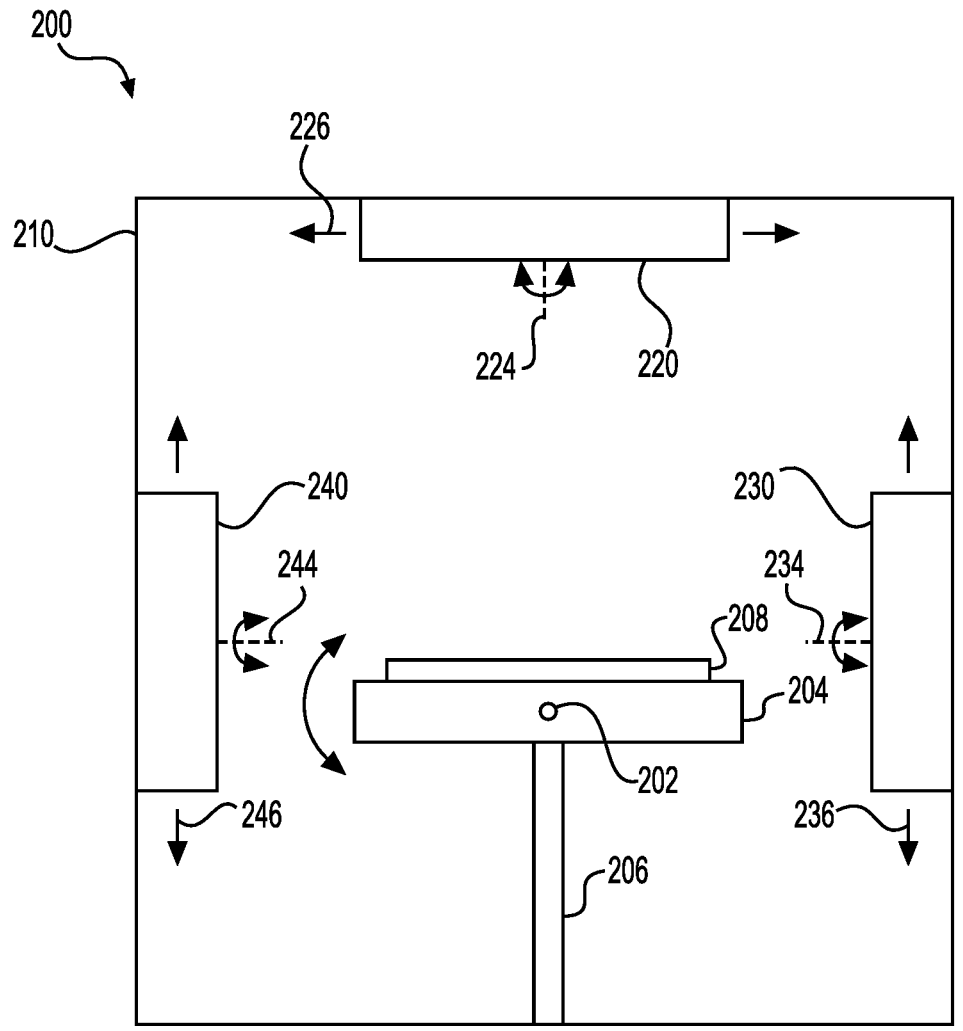
FIG. 5 depicts a schematic side view of a hole forming apparatus in a first position in accordance with some embodiments of the present disclosure.

In some embodiments, the hole forming apparatus 200 includes an enclosure 210, where the substrate support 204 is disposed within the enclosure 210. In some embodiments, the first drill 220 is coupled to a top wall of the enclosure 210. In some embodiments, the second drill 230 and the third drill 240 are coupled to sidewalls of the enclosure 210 on opposite sides of the substrate support 204. In some embodiments, as shown in FIGS. 2A-2B and 3, the first drill 220, the second drill 230, and the third drill 240 are disposed outside of the enclosure 210. In some embodiments, as shown in FIG. 5, the first drill 220, the second drill 230, and the third drill 240 are disposed within the enclosure 210. In some embodiments, at least one of the first drill 220, the second drill 230, and the third drill 240, are disposed within the enclosure 210 while the remaining of the first drill 220, the second drill 230, and the third drill 240 are disposed outside of the enclosure 210.

At 104, the substrate is positioned between a second drill (e.g., second drill 230) and a third drill (e.g., third drill 240). In some embodiments, the substrate is rotated about an elongate axis (e.g., elongate axis 202) of the substrate support. In some embodiments, the substrate is rotated by about 45 degrees to about 135 degrees from the first position to the second position. In some embodiments, the substrate is rotated by about 90 degrees from the first position to the second position. FIG. 3 depicts a schematic side view of a hole forming apparatus in the second position in accordance with some embodiments of the present disclosure. In the second position, the second drill 230 faces the first side 250 of the substrate 208 and the third drill 240 faces the second side 260 of the substrate 208. In some embodiments, the second drill 230 faces the second side 260 and the third drill 240 faces the first side 250.

At 106, the second drill is used to finish the plurality of rough holes from the first side (e.g., first side 250) of the substrate to a first location. In some embodiments, the first location is at least halfway along the length of each hole of the plurality of holes. In some embodiments, finishing the plurality of rough holes comprises at least one of reducing the roughness of the plurality of rough holes, increasing roundness of the plurality of rough holes, increasing a diameter of the plurality of rough holes to a second size, or making the plurality of rough holes more uniform in diameter with respect to each other. For example, the plurality of rough holes may be smaller pilot holes and finishing the plurality of rough holes comprises removing addition material around the smaller pilot holes to form a finished plurality of holes that have at least one of increased hole-to-hole uniformity, increased concentricity, or reduced roughness as compared to the plurality of rough holes. Sidewalls of the finished plurality of holes may have increased perpendicularly with respect to an upper surface (e.g., first side 250) or lower surface (e.g., second side 260) of the substrate than the plurality of rough holes. In some embodiments, the plurality of rough holes are more flared (i.e., gradually wider at one end) than the finished plurality of holes.

In some embodiments, a concentricity of the finished plurality of holes is up to about 15% more concentric than a concentricity of the plurality of rough holes. In some embodiments, a concentricity of the finished plurality of holes is about 0.002 inches to about 0.125 inches. In some embodiments, a roundness of the plurality of rough holes is about 15% greater than a roundness of the finished plurality of holes. In some embodiments, the diameter of the finished plurality of holes, or second size, is up to about 25% larger than the diameter of the plurality of rough holes, or first size. In some embodiments, the second size is about 0.005 inches to about 0.04 inches.

In some embodiments, the plurality of rough holes include a plurality of sets. In some embodiments, the second drill finishes a set of the plurality of sets and then finishes another set of the plurality of sets and continues repetitively until all of the plurality of rough holes are finished from the first side of the substrate. In some embodiments, the substrate rotates about a central axis (e.g., central axis 212) of the substrate after finishing a set of the plurality of sets using the second drill. In some embodiments, the second drill moves between finishing of each set of the plurality of sets by rotating with respect to the substrate (e.g. about central axis 234). In some embodiments, the second drill moves laterally with respect to the substrate (e.g., lateral direction 236) between finishing of each set of the plurality of sets.

At 108, the third drill is used to finish the plurality of rough holes from the second side (e.g., second side 260) of the substrate to the first location or a location at least halfway along the length of each hole of the plurality of rough holes. The second drill and the third drill both finishing roughly half of each hole of the plurality of rough holes advantageously reduces the work required from each of the second drill and the third drill. In some embodiments, the first drill, the second drill, and the third drill, together, form the plurality of holes that are finished. In some embodiments, the third drill finishes the plurality of rough holes from the second side of the substrate in a similar manner as discussed above with respect to the second drill. In some embodiments, the substrate rotates about a central axis (e.g., central axis 212) of the substrate after finishing a set of the plurality of sets using the third drill. In some embodiments, the third drill moves between finishing of each set of the plurality of sets by rotating with respect to the substrate (e.g. about central axis 244). In some embodiments, the third drill moves laterally with respect to the substrate (e.g., lateral direction 246) between finishing of each set of the plurality of sets.

Figure 4:
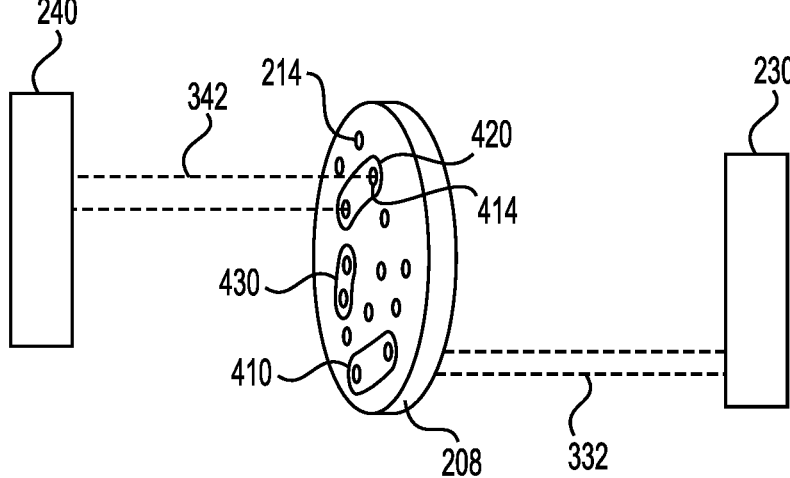
FIG. 4 depicts a schematic partial isometric view of a hole forming apparatus in a second position in accordance with some embodiments of the present disclosure.

In some embodiments, using the second drill to finish the plurality of rough holes is performed simultaneously with using the third drill to finish the plurality of rough holes. In some embodiments, the second drill and the third drill do not simultaneously finish the same hole of the plurality of rough holes. In some embodiments, as shown in FIG. 4, the second drill can finish the first set of the plurality of holes simultaneously while the third drill is finishing the second set of the plurality of holes. FIG. 4 depicts a schematic partial isometric view of a hole forming apparatus in a second position in accordance with some embodiments of the present disclosure. The substrate support 204 is not shown in FIG. 4 to aid in visibility.

In some embodiments, the plurality of sets of the plurality of rough holes 214 includes a first set 410, a second set 420, and a third set 430. Each of the first set 410, the second set 420, and the third set 430 may include two or more holes of the plurality of rough holes 214 (sets of two holes shown in FIG. 4). In some embodiments, the second drill 230 is configured to finish each hole of the first set 410 simultaneously. In some embodiments, the third drill 240 is configured to finish each hole of the second set 420 simultaneously. In some embodiments, the second drill 230 is configured to finish each hole of the first set 410 simultaneously with the third drill 240 finishing each hole of second set 420. One or more of the substrate 208, the second drill 230, or the third drill 240 may be moved to finish the third set 430. The second drill 230 and the third drill 240 are configured to finish all of the plurality of rough holes 214 to form the plurality of holes 414 that are finished.

Referring back to FIG. 3, in some embodiments, the second drill 230 and the third drill 240 are configured to move in the lateral direction 236 and the lateral direction 246, respectively, with respect to the first side 250 and rotate with respect to the first side 250. In some embodiments, the central axis 234 of the second drill 230 is parallel to the central axis 212 of the substrate 208 when the substrate 208 is in the second position. In some embodiments, the central axis 244 of the third drill 240 is parallel to the central axis 212 of the substrate 208 when the substrate 208 is in the second position.

In some embodiments, the second drill 230 and the third drill 240 are laser drills configured to direct photon energy 332 and photon energy 342, respectively, to remove material from the substrate 208 to finish the plurality of rough holes 214 to form the plurality of holes that are finished. In some embodiments, the second drill 230 is a laser drill having a plurality of laser heads to finish multiple holes of the plurality of rough holes 214 simultaneously. In some embodiments, the third drill 240 is a laser drill having a plurality of laser heads to finish multiple holes of the plurality of rough holes 214 simultaneously. In some embodiments, the first drill 220 may be a high-power keyhole laser.

In some embodiments, the second drill 230 and the third drill 240 are rotary drills configured to remove material from the substrate 208 to finish the plurality of rough holes 214. In some embodiments, the second drill 230 is a rotary drill having a plurality of drill bits to finish multiple holes of the plurality of rough holes 214 simultaneously. In some embodiments, the third drill 240 is a rotary drill having a plurality of drill bits to finish multiple holes of the plurality of rough holes 214 simultaneously.

In some embodiments, the second drill 230 and the third drill 240 are water drills configured to direct high-pressure water at the substrate 208 to finish the plurality of rough holes 214. In some embodiments, the second drill 230 is a water drill having a plurality of high-pressure water jets to finish multiple holes of the plurality of rough holes 214 simultaneously. In some embodiments, the third drill 240 is a water drill having a plurality of high-pressure water jets to finish multiple holes of the plurality of rough holes 214 simultaneously.

In some embodiments, the second drill 230 and the third drill 240 are sonic drills configured to remove material from the substrate 208 to finish the plurality of rough holes 214. In some embodiments, the second drill 230 is a sonic drill having a plurality of sonic drill bits to finish multiple holes of the plurality of rough holes 214 simultaneously. In some embodiments, the third drill 240 is a sonic drill having a plurality of sonic drill bits to finish multiple holes of the plurality of rough holes 214 simultaneously.

In some embodiments, the first drill 220 operates at higher power than the second drill 230 and the third drill 240. In some embodiments, the second drill 230 and the third drill 240 are configured to form holes having a higher fidelity than the first drill 220. For example, holes having a higher fidelity may comprise less roughness, increased roundness, and less variation of hole-to-hole diameters.

While the foregoing is directed to embodiments of the present disclosure, other and further embodiments of the disclosure may be devised without departing from the basic scope thereof.

The invention claimed is:

1. A method of forming holes in a substrate for use in a process chamber, comprising:
   mounting the substrate on a substrate support in a first position;
   while in the first position, forming a plurality of rough holes through the substrate to a first size using a first drill powered by a first power source;
rotating the substrate by about 45 degrees to about 135 degrees to a second position along an elongate axis of the substrate orthogonal to a central axis of the substrate that is substantially parallel to the plurality of rough holes; and

while in the second position, finishing a first set of the plurality of rough holes from a first side of the substrate to a second size using a second drill powered by a second power source different than the first power source while finishing a second set of the plurality of rough holes different than the first set of the plurality of rough holes from a second side of the substrate opposite the first side to the second size using a third drill powered by a third power source different than the first power source and the second power source, wherein the second drill and the third drill are configured to form holes having a reduced roughness or increased concentricity than the holes formed by the first drill.

2. The method of claim 1, further comprising moving the second drill after forming the first set of the plurality of rough holes and form a third set of the plurality of rough holes different than the first set of the plurality of rough holes.

3. The method of claim 2, wherein finishing the first set of the plurality of rough holes using the second drill is done simultaneously with finishing of the second set of the plurality of rough holes using the third drill.

4. The method of claim 1, wherein the first drill, the second drill, and the third drill are laser drills.

5. The method of claim 1, wherein the first drill, the second drill, and the third drill are laser drills, rotary drills, water drills, or sonic drills.

6. The method of claim 1, wherein finishing the first set and the second set of the plurality of rough holes comprises at least one of reducing a roughness of the plurality of rough holes, increasing a roundness of the plurality of rough holes, increasing a diameter of the plurality of rough holes, or making the plurality of rough holes more uniform in diameter with respect to each other.

7. The method of claim 1, further comprising rotating the substrate about a central axis of the substrate while forming the plurality of rough holes using the first drill.

8. The method of claim 1, wherein forming the plurality of rough holes through the substrate using the first drill comprises forming the first set of the plurality of rough holes and then moving the first drill to form the second set of the plurality of rough holes.

9. The method of claim 1, wherein the first drill and the second drill are capable of operating simultaneously.

10. The method of claim 1, wherein a concentricity of the finished first set and second set of the plurality of rough holes is up to about 15% more concentric than a concentricity of the plurality of rough holes.

11. The method of claim 1, wherein sidewalls of the finished first set and second set of the plurality of rough holes are more perpendicular with respect to the first side or the second side of the substrate than the plurality of rough holes.

12. The method of claim 1, wherein the holes of the finished first set of the plurality of rough holes have a substantially constant diameter from the first side to the second side of the substrate.

\* \* \* \* \*